United States Patent [19]

Sancier et al.

[11] Patent Number: 4,489,275

[45] Date of Patent: Dec. 18, 1984

[54] HIGH TEMPERATURE SAMPLE HEATING FOR SPECTROSCOPIC STUDIES APPARATUS

[75] Inventors: Kenneth M. Sancier, Menlo Park; Bernard J. Wood, Santa Clara, both of Calif.

[73] Assignee: SRI International, Menlo Park, Calif.

[21] Appl. No.: 416,337

[22] Filed: Sep. 9, 1982

[51] Int. Cl.³ ............................................. G01N 27/00
[52] U.S. Cl. .................................... 324/315; 313/554; 324/307; 324/318; 324/321
[58] Field of Search ............... 324/307, 315, 316, 318, 324/321; 313/547, 554, 555, 44; 250/352

[56] References Cited

U.S. PATENT DOCUMENTS

| | | | |
|---|---|---|---|
| 1,237,210 | 8/1917 | Langmuir | 315/555 |
| 2,117,735 | 5/1938 | Lester | 313/555 |
| 2,940,050 | 6/1960 | Dicke | 324/307 |
| 3,525,928 | 11/1968 | Nagao et al. | 324/315 |
| 4,206,354 | 6/1980 | Small, Jr. | 250/352 |
| 4,240,033 | 12/1980 | Anderson et al. | 324/315 |
| 4,310,781 | 1/1982 | Steinhage et al. | 315/555 |

OTHER PUBLICATIONS

Singer et al., "Microwave Cavity for High Temperature ESR Measurements", pp. 213-214, Review of Scientific Instruments, vol. 32, No. 2, Feb. 1961.

Shoolery, et al., "High Resolution NMR Spectroscopy at Elevated Temperatures", pp. 61-62, Review of Scientific Instruments, vol. 28, No. 1, Jan. 1957.

MacKinnon, "Variable Temperature X-Band EPR Systems with a Variable Cavity Coupler", Review of Scientific Instruments, vol. 43, No. 12, Dec. 1972.

Wren et al., "New Design of an Ion Cyclotron Resonance Cell Capable of Temperature Variation", Review of Scientific Instruments, vol. 49, No. 4, Apr. 1978.

Primary Examiner—Stewart J. Levy
Attorney, Agent, or Firm—John P. Taylor

[57] ABSTRACT

In accordance with the invention, an improved sample heating apparatus is provided comprising an evacuated cylindrical envelope having a first portion of reduced diameter and capable of fitting into a cavity of a spectroscopic analysis device and capable of receiving a sample holder therein. A second portion of the cylindrical envelope has a larger diameter and heating means mounted therein. Radiation shielding means are also carried within the evacuated envelope of the larger diameter portion. The apparatus is also provided with gettering means to react with gases within the evacuated envelope.

20 Claims, 2 Drawing Figures

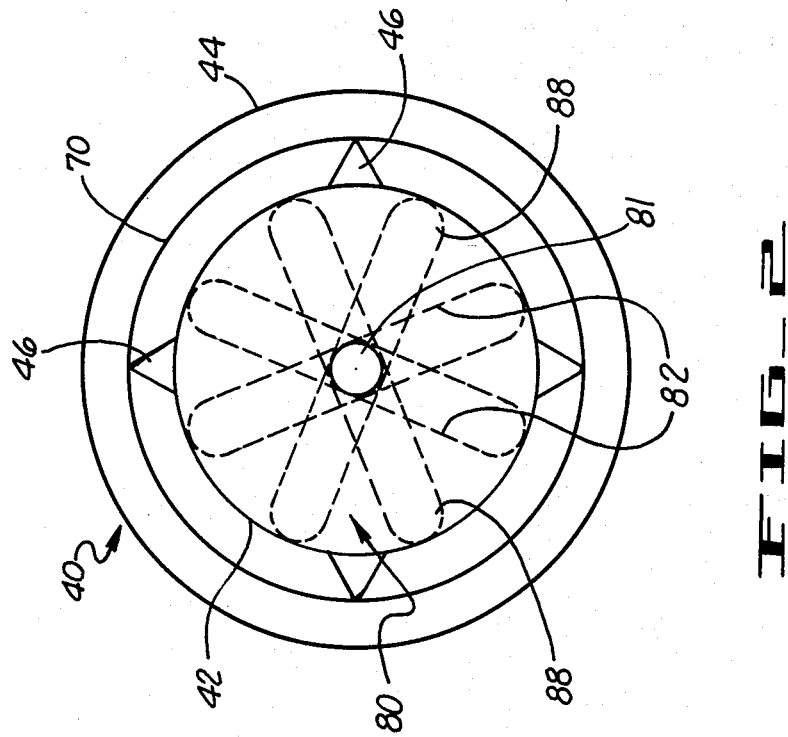
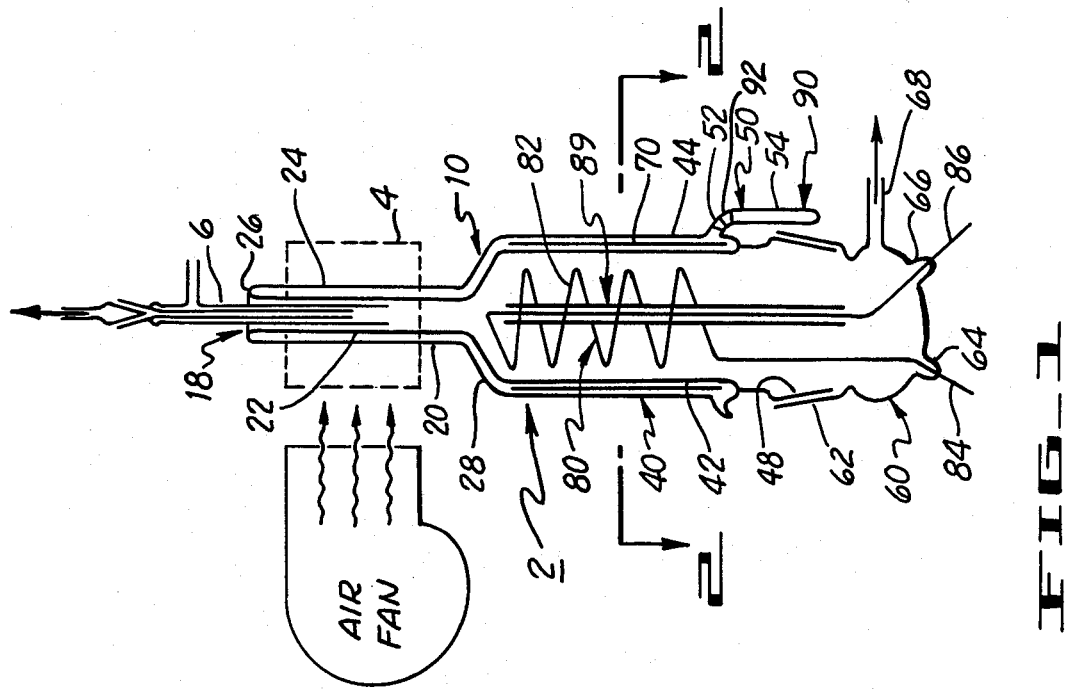

HIGH TEMPERATURE SAMPLE HEATING FOR SPECTROSCOPIC STUDIES APPARATUS

BACKGROUND OF THE INVENTION

1. Origin of Invention

This invention disclosure described herein was made under Department of Energy Contract No. DE AC2180MC14593.

2. Technical Field of the Invention

This invention relates to high temperature heating apparatus. More particularly, this invention relates to high temperature heating for use in heating samples for spectroscopic studies, such as electron spin resonance measurements.

3. Background

The measurements of electron spin resonance or nuclear magnetic resonance desirably includes measurements at elevated temperatures, i.e. as high as 1000° C. Such high temperature measurements, however, are complicated by the need to elevate the sample to a high temperature while maintaining the surrounding cavity within the magnetic field at a much lower temperature; preferably as close to ambient as possible.

It has been proposed, in the past, to thermally isolate and insulate the sample from the surrounding cavity by a cylindrical dewar. For example, Shoolery U.S. Pat. No. 2,864,995 discloses the heating of a gyromagnetic resonance sample for nuclear magnetic resonance spectroscopy analysis using an evacuated cylinder to transport heated gas from a remote source to the sample mounted in the nuclear magnetic resonance spectrometer.

Typically, however, such devices are limited in temperature due, in part, to the deterioration of radiation heat shielding such as deposited films of silver or platinum, which tend to migrate or react with the walls of the quartz envelope at high temperatures, i.e. over 400° C. Furthermore, at temperatures above 400° C., gases released from the quartz envelope tend to limit the life cycle of the dewar to about 25 hours before re-evacuation becomes necessary.

It would, therefore, be desirable to provide a sample heating apparatus capable of operating at temperatures of 400°–1000° C. over an extended period of time without serious loss of vacuum or destruction of the radiant heat shield surrounding the heater. It would also be desirable to provide a sample heating apparatus having a radiant heat shield with a stable reflective surface.

SUMMARY OF THE INVENTION

It is, therefore, an object of the invention to provide an improved sample heating apparatus for heating a sample in the cavity of a spectroscopic analysis device. It is another object of the invention to provide a sample heating apparatus having a heat shield capable of functioning at temperatures above 400° C. It is yet another object of the invention to provide a sample heating apparatus having an evacuated insulation envelope capable of operating at elevated temperatures for extended periods of time without reevacuation. It is a further object of the invention to provide a sample heating apparatus having gettering means within the evacuated insulation envelope to react with gases within the envelope. It is a still further object of the invention to provide renewable gettering means to permit gettering operations after the initial gettering to thereby extend the life cycle of the evacuated envelope prior to reevacuation. It is yet a further object of the invention to provide improved heating means capable of functioning at an elevated temperature in air without necessitating an inert or reducing atmosphere.

These and other objects of the invention will be apparent from the drawings and accompanying description.

In accordance with the invention, an improved sample heating apparatus is provided comprising an evacuated cylindrical envelope having a first portion of reduced diameter and capable of fitting into a cavity of a magnetic resonance spectrometer and capable of receiving a sample holder therein. A second portion of the cylindrical envelope has a larger diameter and heating means mounted therein. Radiation shielding means are also carried within the evacuated envelope of the larger diameter portion. The apparatus is also provided with gettering means to react with gases within the evacuated envelope.

BRIEF DESCRIPTION OF THE DRAWINGS

FIG. 1 is a vertical cross-sectional view of the heating apparatus of the invention.

FIG. 2 is an enlarged cross-sectional view of the larger diameter portion of the evacuated envelope taken along lines 2—2 in FIG. 1.

DESCRIPTION OF THE INVENTION

Referring now to FIG. 1, the sample heating apparatus of the invention is generally illustrated at 2. Heating apparatus 2 comprises a generally cylindrical evacuated envelope 10 having a smaller diameter portion 20 and an enlarged diameter portion 40. Within the evacuated envelope of enlarged diameter portion 40 is a reflector 70. A centrally disposed heater 80 is mounted coaxially within enlarged diameter portion 40 via base member 60.

Shown in dotted lines at 4 is the outline of a resonant cavity, such as an electron spin resonance (ESR) cavity of an ESR spectrometer. Fitted within the smaller diameter portion 20 of heating apparatus 2 is a sample holder 6 containing the sample to be analyzed. The smaller diameter portion 20 of heater apparatus 2 and sample holder 6 received therein are both inserted into cavity 4.

The evacuated envelope 10 is constructed preferably of quartz which is transparent to the magnetic flux and RF energy within the cavity yet capable of holding a high vacuum, i.e., less than $10^{-6}$ torr. Smaller portion 20 comprises an inner quartz cylinder 22 and an outer quartz cylinder 24 which are joined at the top at 26 and which fan out at shoulder 28. High purity quartz tubing is used in fabricating smaller portion 20. Larger portion 40 comprises an inner cylinder 42 which necks down to join inner cylinder 22 at shoulder 28 and an outer cylinder 44 which necks down to join outer cylinder 24 also at shoulder 28.

In accordance with the invention, there is concentrically situated between inner wall 42 and outer wall 44, a cylindrical metal reflector 70. Reflector 70 preferably is a highly polished stainless steel cylinder capable of withstanding temperatures as high as 900° C. during bake-out and evacuation of the quartz envelope. Other metals may also be useful provided they possess the requisite reflectivity and temperature stability at the operating temperature. The stainless steel comprising the cylinder need not be thick since it provides no mechanical strength to the device. A 3 mil thickness stainless steel shim stock has been used successfully.

However, since the metal cylinder is capable of conducting some heat from cylindrical wall 42 to cylindrical wall 44, it is preferred that the cylinder be mounted coaxially to cylinder walls 42 and 44 so as to not provide a heat conduction path therebetween. Thus, as shown in FIG. 2, reflector 70 may be positioned coaxially to cylinder walls 42 and 44 by providing spacers 46 between reflector 70 and inner cylinder wall 42. It should be noted here that if spacer 46 is a rigid member rather than a yieldable or spring-like member, it is preferred to place the spacer between inner cylinder wall 42 and reflector 70 rather than between reflector 70 and outer cylinder wall 44 due to the greater expansion coefficient of the metal. In any event, it will be understood that the use of spacers within the cylinder should not in any way interfere with the mechanical stability of the device. Alternatively, reflector 70 may be formed to have an inner diameter which, at room temperature, is just slightly larger than the OD of cylinder wall 42 so that reflector 70 will fit somewhat snugly, when cool, around cylinder wall 42. This will serve in substitute for spacers 46 to keep reflective cylinder 70 out of contact with outer cylinder wall 44.

A further alternative which has been used sucessfully comprises the use of a stainless steel sheet somewhat longer than the circumferated path so that the edges of the sheet overlap when formed into a circle. The sheet is then not fabricated into a closed circle to facilitate expansion and contraction.

Attached to enlarged diameter portion 40 of evacuated envelope 10 is a hollow finger portion 50. In accordance with the invention, finger 50 contains gettering means 90 which, in the preferred embodiment comprises a series of metal getter rings 92 which are constructed of a gettering material, such as KEMET type U-96, a barium alloy gettering material available from the Union Carbide Corporation. In accordance with the preferred embodiment, getter rings 92 have a diameter just slightly smaller than the ID of finger 50. By providing a relatively snug fit between getter rings 92 and the inner wall of finger 50, all but one of the getter rings may be initially stored in curved portion 52 of finger 50 while the first ring is tapped down into straight portion 54 of finger 50. The getter ring 92 in straight portion 54 may then be flashed by localized heating, preferably by an RF induction heater, (after evacuation and sealing of envelope 10 as will be described below) while still reserving the remaining getter rings for subsequent gettering as occluded gases in the quartz envelope are released during operation at elevated temperatures.

The evacuation and sealing of envelope 10 with the stainless steel reflector sealed therein must be undertaken in carefully incremented temperature stages due to the initial presence of moisture in the quartz envelope that can react with and corrode the stainless steel reflector at elevated temperatures. The envelope is therefore initially heated to a temperature of about 75° C. while evacuating the gases and moisture until a vacuum of about 1/10 to 1/100 Torr is reached (usually about 30 minutes). The temperature is then raised another 50° C. and maintained at this temperature until the vacuum again reaches the above recited range. This is repeated in 50° C. intervals until a temperature of 275° C. is achieved at which time the temperature intervals are increased by 100° C. increments until a baking temperature of 875° to 900° C. is reached. The envelope is maintained at this temperature for several hours while evacuation at about 10 torr or less is continued. The envelope is then sealed at 100 and the first getter ring is flashed by an RF heater placed in proximity to straight portion 54.

It should be noted here that the bake-out of envelope 10 must be done without subjecting finger 50 and gettering means 90 to the elevated bake-out temperatures which would volatilize the getter material. This may be accomplished by localizing the heating and bake-out of inner portion 20 and outer portion 40 of envelope 10 while providing cooling means to finger 50.

Outer portion 40 of evacuated envelope 10 is provided with a descending skirt 48 to provide a ground glass stopper seal with a corresponding wall portion 62 of base 60. Base 60 provides a mounting for heater 80 via mounting contacts 64 and 66 which comprise glass seals through which metal leads 84 and 86 from heater 80 pass to provide connection to an external D.C. power source.

Base 60 is also provided with an open tube portion 68 through which air or other heat exchange fluid may be pumped for passage through the heater coils 88 of heater 80 and then brought into contact with sample holder 6 before egress from the apparatus at the open top end 18 thereof.

In a preferred embodiment, open tube 68 is connected to a source of cylinder air under pressure which provides a source of air of low hydrocarbon content to inhibit undesirable volatilization or deposition within apparatus 2 or the outer wall of sample holder 6.

Referring to FIGS. 1 and 2, the preferred configuration of coils 82 of heater 80 is illustrated (in cross section in FIG. 2). Coils 82 wound as shown may be described as a Porcupine-type winding made by the Kanthal Corporation having loops 88 radiating in all directions around a central axis 81 to define an outer diameter only slightly smaller than the ID of inner cylinder 42 of evacuated envelope 10. The Porcupine heater configuration provides a large surface area for efficient heating of the heat exchange gases. Coils 82 preferably comprise a heater wire capable of functioning at elevated temperatures in an air atmosphere to avoid more costly use of inert or reducing gases, such as nitrogen or hydrogen. In the preferred embodiment, for operation up to about 800° C., heater coils 82 are formed of Kanthal, a well known Nichrome-type heater wire available from the Kanthal Corporation.

To provide added support for coils 82, heater 80 preferably is provided further with an alumina support rod 89 which is coaxially mounted in the central axis 81 defined by coils 82. Rod 89 may be of slightly larger diameter than axis 81 and then threaded to provide thread roots defining a diameter sufficiently smaller than axis 81 to permit insertion of rod 89 into coils 82 by rotation to provide support for coils 82. Alternatively, coils 82 may be cemented to rod 89. In operation then, leads 84 and 86 are connected to a D.C. power source (A.C. should be avoided near the magnetic field when using the preferred embodiment just described because the mechanical vibrations would be transmitted to the cavity and produce electrical noise). Air is then forced through tube 68 to pass over and through the heater windings, and the heater is turned on. The heated air then contacts sample holder 6 thereby transmitting heat to the sample therein. Reflector 70 and evacuated envelope 10 preserve the heat within the apparatus to provide maximum heating to sample holder 6 while minimizing heat losses. It should be noted that other heater windings can also be used which may be smaller or larger than the preferred embodiment described. Furthermore, a second, reverse, winding can be used if one wishes to utilize AC without producing electrical noise as described above.

The heat transmitted to the sample is dependent upon the temperature of the heater and the volume of air passing therethrough. The maximum temperature will be dependent upon the choice of heater materials as well as the melting point of the envelope. Thus a maximum temperature will be about 1000° C. In the illustrated embodiment, the heater is run at a constant voltage of 100 volts D.C. with varying current and air volume for temperature selectivity as shown in the table below which represents a heater precalibrated for desired temperatures. Alternatively, a thermocouple or other temperature measurement device can be mounted in an appropriate position adjacent the sample and the current (or voltage) adjusted as needed to achieve the desired temperature. The air volume will, of course, be dependent on the physical dimensions of the heating apparatus. In the illustrated embodiment, the larger portion containing the heater has an ID of about 40 mm. The narrow portion which fits into the cavity and receives the sample holder has an ID of about 7 mm while the sample holder has an OD of about 5 mm. Open tube 68 in base member 60, through which the pressurized air enters the apparatus, has an ID of about 7 mm.

TABLE I

| Temperature (°C.) | Current (Amps) | Air (cubic ft/hr) |
| --- | --- | --- |
| 100 | 1.1 | 15 |
| 300 | 2.5 | 15 |
| 400 | 3.0 | 15 |
| 500 | 3.3 | 15 |
| 600 | 4.5 | 20 |
| 650 | 5.0 | 20 |
| 700 | 5.5 | 25 |

As illustrated in FIG. 1, some heat may still escape from apparatus 2 which would have a deleterious effect upon cavity 4. The cavity may, therefore, be cooled using fan 100 as illustrated or, alternatively, cavity 4 may be water-cooled by the provision of a water-cooled jacket around the cavity.

In either event the apparatus may be operated for extended intervals without the need for re-evacuation of the envelope as in the prior art. Furthermore, should further gases be released from the quartz envelope which then increase the pressure or react with the metal surface of the reflector to decrease reflectivity, the apparatus may be regettered by releasing one of the getter rings 92 into the straight portion 54 of finger 50 and flashing the getter ring. Apparatus, thus constructed, has been found capable of several hundred hours of operation in comparison with only about 25 hours in the prior art.

While minor modifications may be made to the preferred embodiments described herein, the invention should be limited only by the scope of the appended claims.

What is claimed is:

1. An improved sample heating apparatus comprising a double-walled evacuated cylindrical envelope having a first portion of reduced diameter capable of fitting into a cavity of a spectroscopic analysis device and capable of receiving a sample holder therein and a second portion of larger diameter having heating means mounted therein; means for passing heat generated in said second, larger diameter portion into said first reduced diameter portion to heat said sample holder therein; radiation shielding means comprising metallic means having a reflective surface thereon carried within the evacuated envelope of said larger diameter portion; and gettering means to react with gases within said evacuated envelope.

2. The apparatus of claim 1 wherein said envelope includes an appendage external to said envelope and in communication with the interior of said envelope and containing said gettering means therein.

3. The apparatus of claim 2 wherein said gettering means comprise a plurality of getter materials.

4. The apparatus of claim 3 wherein said plurality of getter materials comprise rings of getter metal having an outer diameter approximating the inner diameter of said appendage to permit individual gettering rings to be flashed independently.

5. The apparatus of claim 4 wherein said appendage and said rings are shaped to permit multiple flashing of getter materials by RF heating means.

6. The apparatus of claim 5 wherein said radiation shielding comprises a metal cylinder within said larger diameter portion of said evacuated envelope capable of withstanding temperatures of 400° to 700° C.

7. The apparatus of claim 6 wherein said metal cylinder comprises a stainless steel having a reflective surface thereon.

8. The apparatus of claim 7 wherein said stainless steel cylinder is mounted coaxially to said evacuated envelope walls to prevent heat transfer through said cylinder from the inner wall to the outer wall.

9. The apparatus of claim 8 wherein spacers between said stainless steel cylinder and an inner wall of said evacuated envelope maintain said stainless steel cylinder coaxially to said evacuated envelope walls.

10. The apparatus of claim 8 wherein said stainless steel cylinder has an ID slightly larger than the OD of an inner wall of said evacuated envelope whereby said stainless steel cylinder is maintained coaxially to said evacuated envelope walls.

11. The apparatus of claim 8 wherein said stainless steel cylinder comprises a sheet formed into a cylinder having overlapping ends to permit the cylinder to expand with heat.

12. The apparatus of claim 1 wherein said envelope comprises a material transparent to magnetic flux and RF radiation and capable of maintaining a high vacuum.

13. The apparatus of claim 12 wherein said envelope comprises quartz.

14. The apparatus of claim 1 wherein said heating means therein are capable of operating in an air atmosphere at temperatures up to 700° C.

15. An improved sample heating apparatus comprising: a double-walled evacuated cylindrical envelope having a first portion of reduced diameter capable of fitting into a cavity of a spectroscopic analysis device and capable of receiving a sample holder therein and a second portion of larger diameter having heating means mounted therein; radiation shielding means carried within the larger diameter portion of said evacuated envelope comprising a stainless steel cylinder having a reflective surface thereon and being capable of withstanding temperatures of 400° C. to 700° C., said envelope being evacuated by stepped elevation of temperature to inhibit reaction of moisture within said envelope with said stainless steel cylinder; and gettering means comprising a plurality of rings of getter material locatable in an appendage external to said envelope, said rings having an outer diameter approximating the inner diameter of said appendage, said rings and appendage being shaped to permit individual gettering rings to be flashed independently by RF heating means to react with gases within said evacuated envelope.

16. An improved sample heating apparatus comprising a double-walled evacuated cylindrical envelope having a first portion of reduced diameter capable of fitting into a cavity of a spectroscopic analysis device and capable of receiving a sample holder therein and a second portion of larger diameter having heating means mounted therein capable of operating in an air atmosphere at temperatures up to 700° C. comprising a coil heater having a coil formation defining an outer diameter corresponding to the inner diameter of said larger portion of said evacuated envelope to provide support for said heater coils; radiation shielding means carried within the evacuated envelope of said larger diameter portion; and gettering means to react with gases within said evacuated envelope.

17. The apparatus of claim 16 wherein said heater coils are further supported by a central ceramic rod having an outer diameter approximating central opening defined by said heater coils.

18. The apparatus of claim 17 wherein said central ceramic rod comprises an alumina rod.

19. The apparatus of claim 18 wherein said alumina rod is threaded to receive said heater coils within said threads to provide support for said heater coils thereby.

20. The apparatus of claim 18 wherein said heater coils are cemented to said alumina rod to provide support for said heater coils thereby.

* * * * *